United States Patent [19]

Gaddy et al.

[11] Patent Number: 5,011,544
[45] Date of Patent: Apr. 30, 1991

[54] SOLAR PANEL WITH INTERCONNECTS AND MASKING STRUCTURE, AND METHOD

[75] Inventors: Edward M. Gaddy, Potomac; Ramon Dominguez, Rockville, both of Md.

[73] Assignee: Solarex Corporation, Rockville, Md.

[21] Appl. No.: 404,999

[22] Filed: Sep. 8, 1989

[51] Int. Cl.⁵ ............... H01L 31/05; H01L 31/052
[52] U.S. Cl. .......................... 136/246; 136/244; 136/251; 136/256; 437/2
[58] Field of Search ............ 136/244, 246, 251, 256; 437/2-5, 205, 211

[56] References Cited

U.S. PATENT DOCUMENTS

| | | | |
|---|---|---|---|
| 3,990,097 | 11/1976 | Lindmayer | 136/256 |
| 4,116,718 | 9/1978 | Yerkes et al. | 136/246 |
| 4,171,989 | 10/1979 | Pryor | 136/256 |
| 4,331,703 | 5/1982 | Lindmayer | 427/37 |
| 4,347,263 | 8/1982 | Whitehouse | 427/74 |
| 4,392,010 | 7/1983 | Lindmayer | 136/256 |
| 4,707,561 | 11/1987 | Hewig et al. | 136/256 |

OTHER PUBLICATIONS

Sales brochure "MSX-10 & MSX-5 Photovoltaic Modules", published Jan. 1988, Solarex Corp. Rockville, MD 20850.
Sales brochure "MSX-LITE Photovoltaic Modules", published Dec. 1988, Solarex Corp. Rockville, MD 20850.

Primary Examiner—Aaron Weisstuch
Attorney, Agent, or Firm—Finnegan, Henderson, Farabow, Garrett & Dunner

[57] ABSTRACT

A solar panel in which the bus-and-interconnect structures are visually masked, to improve not only aesthetics but also the operational characteristics of the panel. A transparent superstrate for the panel has on a surface juxtaposed to the radiation-receiving surfaces of the cells a pattern masking material just sufficient, with manufacturing tolerances, to mask the generally non-symmetrical interconnect structure in a substantially more uniform, symmetrical manner. The masking material may be matte-finish (paint) or highly reflective (a metallic deposit), and in either case may be applied by the same process (e.g., silk screen). The reflective mask structure inhibits heat build-up in the panel; and the matte-finish mask structure is generally unobtrusive and aesthetically pleasing, as required for example, in vehicular applications. A redundant bus structure yields surprisingly compact interconnects, with increased versatility in arrangement of grid patterns of collector electrodes, and is highly compatible with the masking structures and techniques.

26 Claims, 8 Drawing Sheets

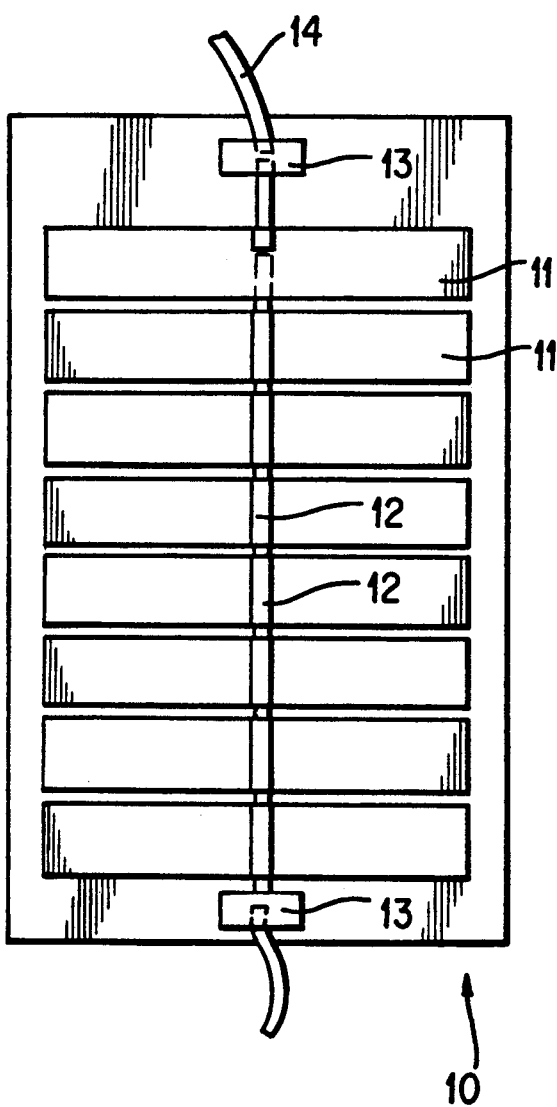 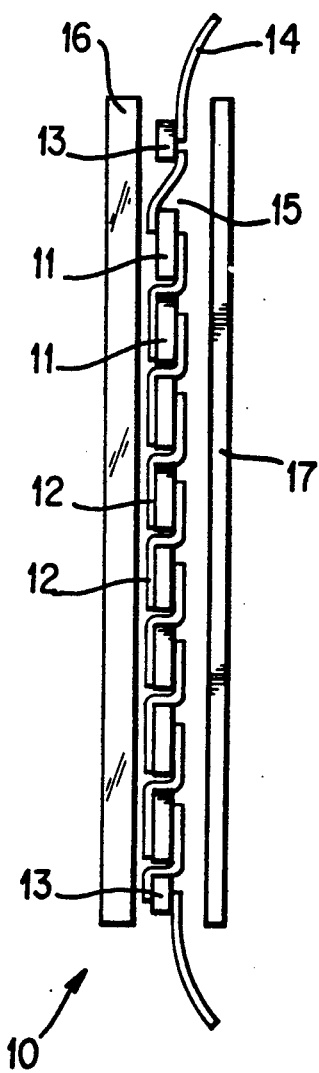
FIG. IA PRIOR ART          FIG. IB PRIOR ART

SOLAR PANEL WITH INTERCONNECTS AND MASKING STRUCTURE, AND METHOD

BACKGROUND OF THE INVENTION

1. Field of the Invention

The present invention relates to solar cells and arrays of such solar cells, and more particularly, to the covers or superstrates for such arrays.

2. Description of the Related Art

Solar cells are connected in parallel and in series to obtain voltage and current of any value desired by the manufacturer of the panel.

FIG. 1 illustrates a typical prior art array of such cells, generally referred to as 10. Such a prior art array consists of a transparent cover, 16, solar cells, 11, a means of electrically connecting the cells known as an interconnect, 12, tabs for attaching wires to the panel, 13, transparent adhesive to hold the panel together 15, a back cover 17, and wires 14. A photocopy of the panel FIG. 1 was drawn from is given as FIG. 3.

FIG. 2 illustrates the solar cells which form a part of the solar panel shown in FIG. 1. The solar cell shown, generally referred to as 11, has a front contact or bus, 22, to which an interconnect may be attached. The solar cell typically has grids of collecting electrodes, 21 which conduct electricity from the front surface of the cell to the front contact.

The area on the front of the cells which is covered by the contact does not produce power, unlike those areas of the cell which are not covered by the contact or the grids. These covered areas otherwise serve no function. Similarly, the areas of the panel between cells and outside the periphery of the cells do not function.

In addition to the above considerations, the solar cells and the interconnects are typically not in alignment even though care is taken to achieve alignment, as may be seen in FIG. 3.

Therefore, it is an object of the present invention to solve the alignment problem. It is also an object of the invention to cool the panel and make it operate more efficiently. This object arises because cool solar cells operate more efficiently than warm solar cells.

It is a further object of the present invention to provide a cover to the solar panel which will provide the appearance of having the solar cells and busses more perfectly aligned.

SUMMARY OF THE INVENTION

According to the invention, the above-described problems are solved by including a substantially transparent superstrate on said solar panel, and means on a selected surface of the superstrate for masking the busses and interconnects.

According to a feature of the invention, the orientations of the grids of the respective solar cells or groups of solar cells can be maintained substantially parallel or can be arranged in an aesthetically pleasing pattern, the masking means effecting hiding the heterogeneous arrangement of busses or interconnects that may be required therefor.

According to a further feature of the invention, selected material can be deposited or painted on the superstrate to inhibit heat absorption by, or promote cooling of, otherwise non-productive areas of the solar panel.

It is one aspect of the invention that it is typically advantageous to provide the masking means on the back, or interior, surface of the superstrate, as that provides a desirable proximity between the masking means and the masked regions.

According to still another feature of the invention, a method for assembling a solar panel comprises depositing upon a plurality of solar cells having radiation receiving surfaces and opposed back surfaces, individual contacts upon the back surfaces; including forming interconnection leads extending from the contacts; interconnecting the plurality of solar cells in a substantially regular array with a selected pattern of conductors; masking the selected pattern of conductors, including depositing a masking pattern of material upon a selected surface of a transparent superstrate, and mounting the plurality of the solar cells upon the transparent superstrate by joining said radiation receiving surfaces to a surface of said transparent superstrate with the leads and conductors substantially marked by the masking pattern.

According to still further features of the invention, parallel or selected arrangements of the grids of collecting electrodes can be achieved by provision of redundant busses on the solar cells, and the interconnection of selected ones of the redundant busses to interconnect the cells within the bounds of the active cell arrays.

Advantageously, the just-described arrangements are highly compatible with the masking arrangements of the invention and facilitate aesthetically pleasing arrangements of the finished solar panel with surprisingly little loss of silicon area that is active in photovoltaic production. For example, some of the arrangements are advantageous for vehicular "sun roof" installations, yielding both a solar panel and a "see-through" open area.

BRIEF DESCRIPTION OF THE DRAWINGS

Further features and advantages of the invention will become apparent from the following detailed description taken together with the drawing, in which:

FIGS. 1A and 1B respectively show front and side views of a simplified prior art solar panel;

DETAILED DESCRIPTION

Figure 4:
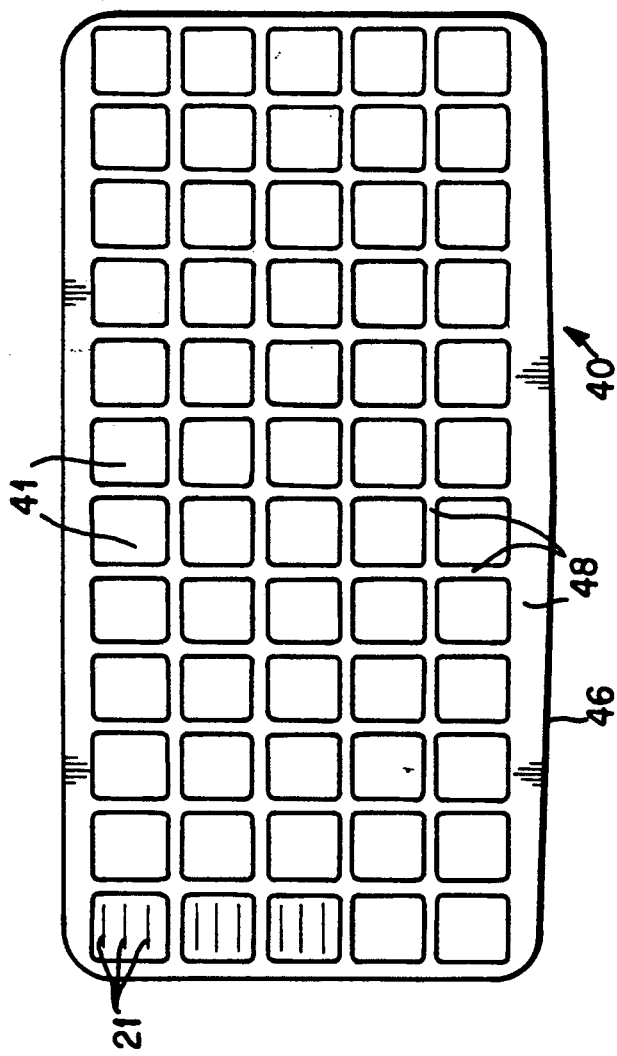
FIG. 4 is a plan view of a solar panel according to the invention.

In the illustrative embodiment of FIG. 4, a solar panel 40 comprises a glass superstrate 46, on the back (nonexposed or interior) surface of which there appears masking medium 48, which has a regular, lattice-like appearance. Behind the openings of medium 48 are disposed individual solar cells 41, which are illustratively conventional solar cells like solar cells 11 of FIG. 1 and FIG. 2, interconnected by bus-and-interconnect structures like bus-and-interconnect structures 12, 13, 14 and 22 of FIGS. 1 and 2, but which are not visible because they are directly behind masking medium 48. It should be noted, nevertheless, that bus-and-interconnect structures 12, 13, 14 and 22 have been moved to the edges of the cells 41 in FIG. 4. The grids of collecting electrodes 21 are illustratively all parallel in FIG. 4. A more definitive description of the construction of solar cells like solar cells 41 may be found in, for example, U.S. Pat. No. 4,331,703 to Joseph Lindmayer (May 25, 1982); but most other solar cell constructions for solar panels are also feasible for purposes of the present invention.

To maintain the parallel, or substantially parallel orientation of the respective grids for successive rows of solar cells 41, conductive busses are deposited in a parallel, closely spaced, or proximate arrangement just outside the limits of the array of solar cells 41 in order to achieve the serial interconnection of successive rows of cells in a serpentine manner. These busses are also masked, or hidden, by portions of masking medium 48. Even though such bus arrangements generally destroy the symmetrical appearance of the array, it is seen that the masking medium 48 can restore the apparent symmetry of the array with the loss of relatively little active solar cell area.

Figure 5:
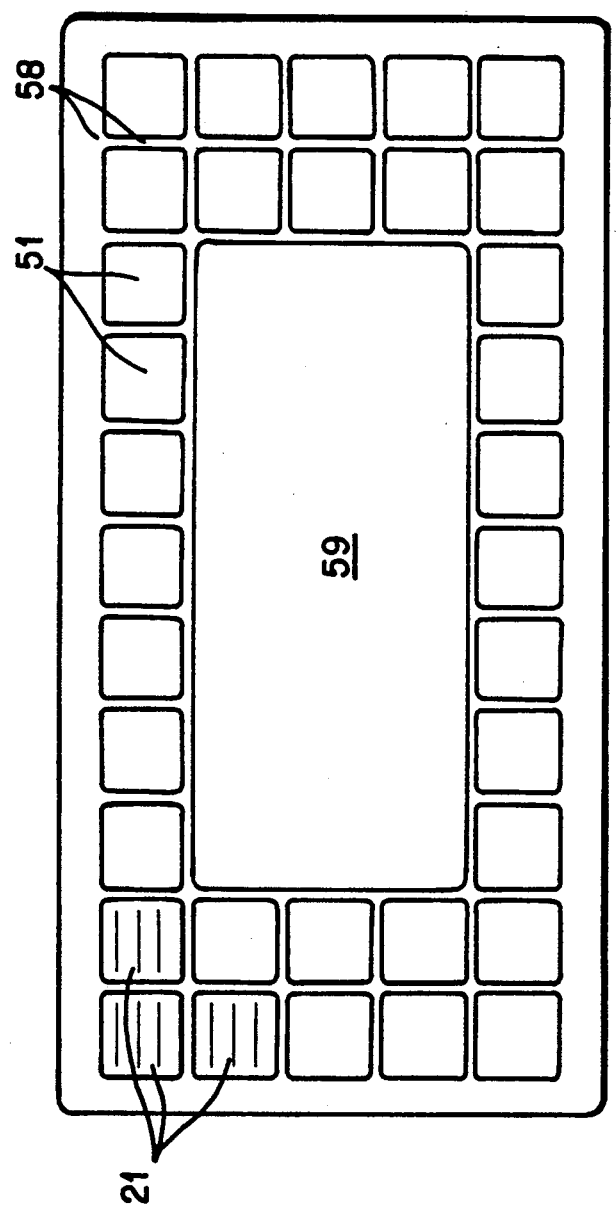
FIG. 5 is a plan view of another solar panel according to the invention.

Symmetry of appearance can be nearly mandatory in some applications. For example, for solar panel installation in a vehicle with a sun roof, the interception of sufficient solar flux may require arranging a solar panel around the periphery of the sun roof. FIG. 5 shows a modified embodiment for this purpose.

In FIG. 5, solar cells 51 are arranged around a central transparent area 59 of the sun roof; masking medium 58 hides the bus and interconnect structures required for serial (or other) interconnection in this arrangement. Preferably, the grids of collecting electrodes 21 are maintained all parallel (or substantially parallel, considering the curvature of the roof) in FIG. 5.

Figure 6:
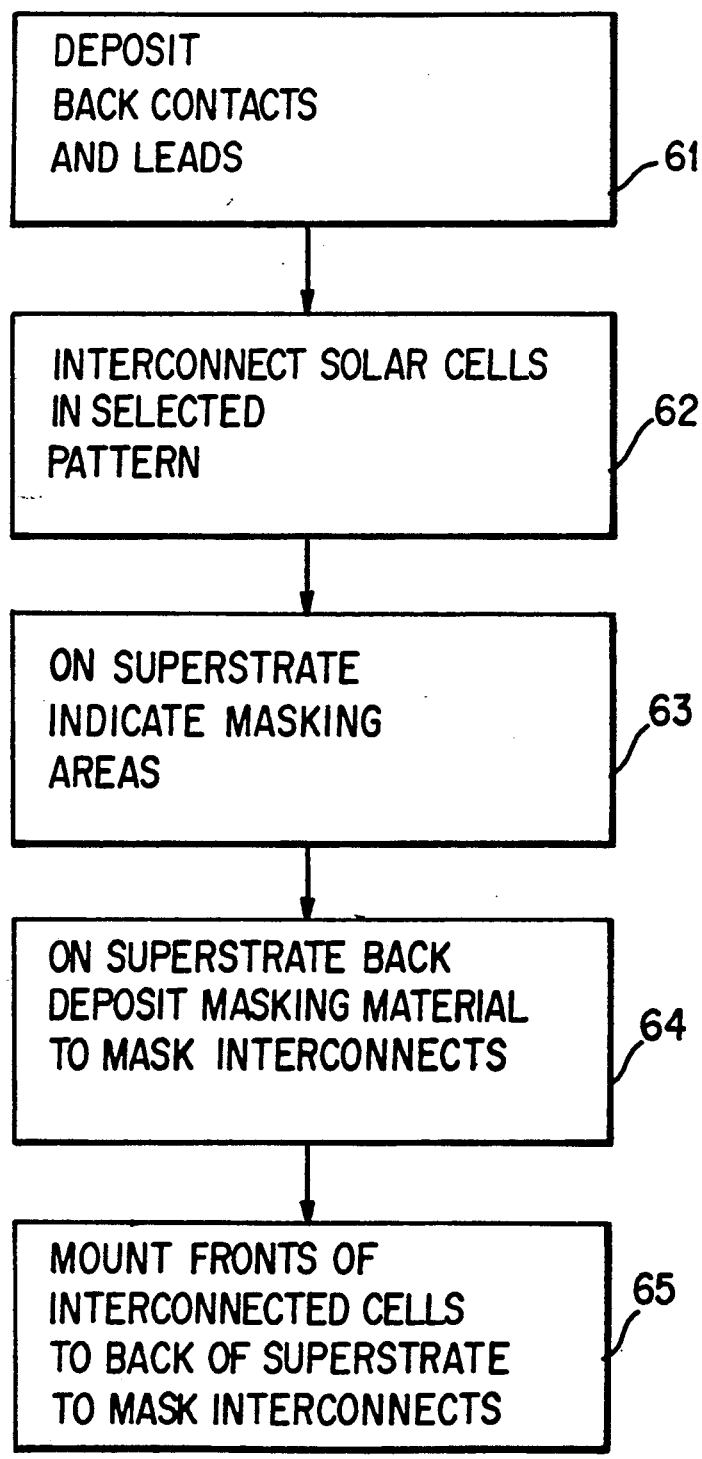
FIG. 6 is a flow diagram of a method according to the invention.

The preferred method for assembling a solar panel in accordance with the present invention will now be described, with reference to the flow diagram of FIG. 6.

Figure 2A:
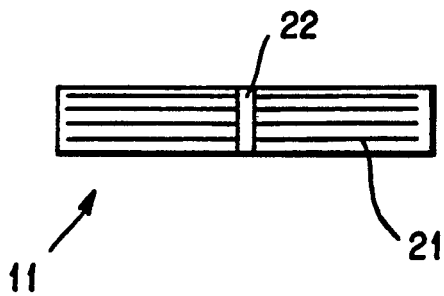
FIGS. 2A and 2B respectively show front and rear views of a typical solar cell of the panel of FIG. 1.
Figure 2B:
Figure 3:
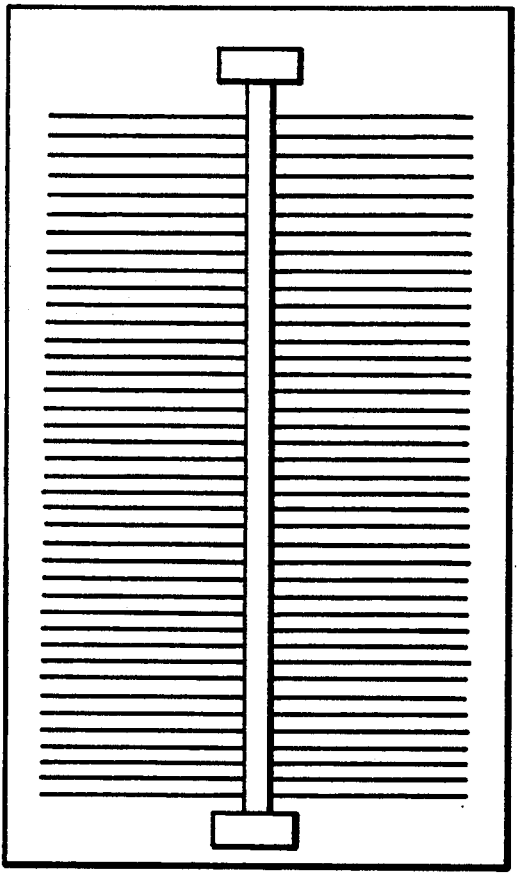
FIG. 3 shows pictorially the relationship between the collecting grids in a typical prior art bus and interconnection arrangement.

First, at step 61 on the individual typically polycrystalline silicon solar cells, there are deposited, by any of the known techniques, back contacts 23 and leads or interconnects 12. At step 62, the free ends of the interconnects 12 are then joined to the front busses 22 of two adjacent cells in a row, the cells being arranged in a jig in a selected pattern. The interconnects 12 and busses 22 have been formed at the edges of the cells, rather than as shown in FIG. 1 and FIG. 2. The arrangement is typically placed in a transparent adhesive on a back cover; but this is not required and can be omitted in other versions, such as the transparent amorphous silicon solar cell panels which are increasingly available and in demand. At step 63, the bus-and-interconnect pattern, as created in the jig, is then transferred to a surface of superstrate 46, typically a glass sheet. The transferred pattern is a mirror-image pattern; and the affected surface of superstrate 46 is the surface which will face the solar cells. In the flow diagram of FIG. 6, this step is labeled as "indicate masking areas." The indicated masking areas are provided with sufficient tolerances to hide completely the peripheral conductive structures of the cells, even with typical manufacturing variations. More specifically, the indicating step preferably comprises creating a silk screen pattern in which the areas corresponding to the masking areas are not occluded, so that the masking material can pass through.

Next, at step 64, on the back of superstrate 46, a paint-like masking material (for a matte-finish) or fine particles of a reflective metal (for a reflective finish) are directed through the silk screen pattern to deposit the selected masking material.

Finally, at step 64, the superstrate so prepared is aligned with the solar cell array, with the masking medium facing the solar cells and joined thereto. In other words, the solar cells are mounted on the back of the superstrate with their radiation-receiving surfaces facing the superstrate surface bearing masking material.

Many variations of these steps are possible within their broad intent. Even photolithographic techniques are an option.

While not preferred, it is feasible, and less expensive, to deposit the masking material on the opposite (exposed) superstrate surface.

The interconnecting step can be varied in all the manners known in the art, thereby producing bus arrangements beyond the bounds of the solar cell array itself. Such variations typically create a need for only minor changes in the widths of masking areas, which in any event are kept symmetrical, at least bilaterally symmetrical for any one solar panel, thereby yielding a harmonious and "finished" external appearance.

Since, in many installations, it is desired that solar panels be unobtrusive, the masking material of choice is a matte black paint or coating; and the solar cells are chosen to have bluish appearance.

In still other installations, preventing excessive heating of the panel is still more important; and the masking medium is then selected to be a highly reflective metal, to reject solar radiation that cannot be productive of photovoltaic power because of the positioning of busses and interconnects.

Figure 7:
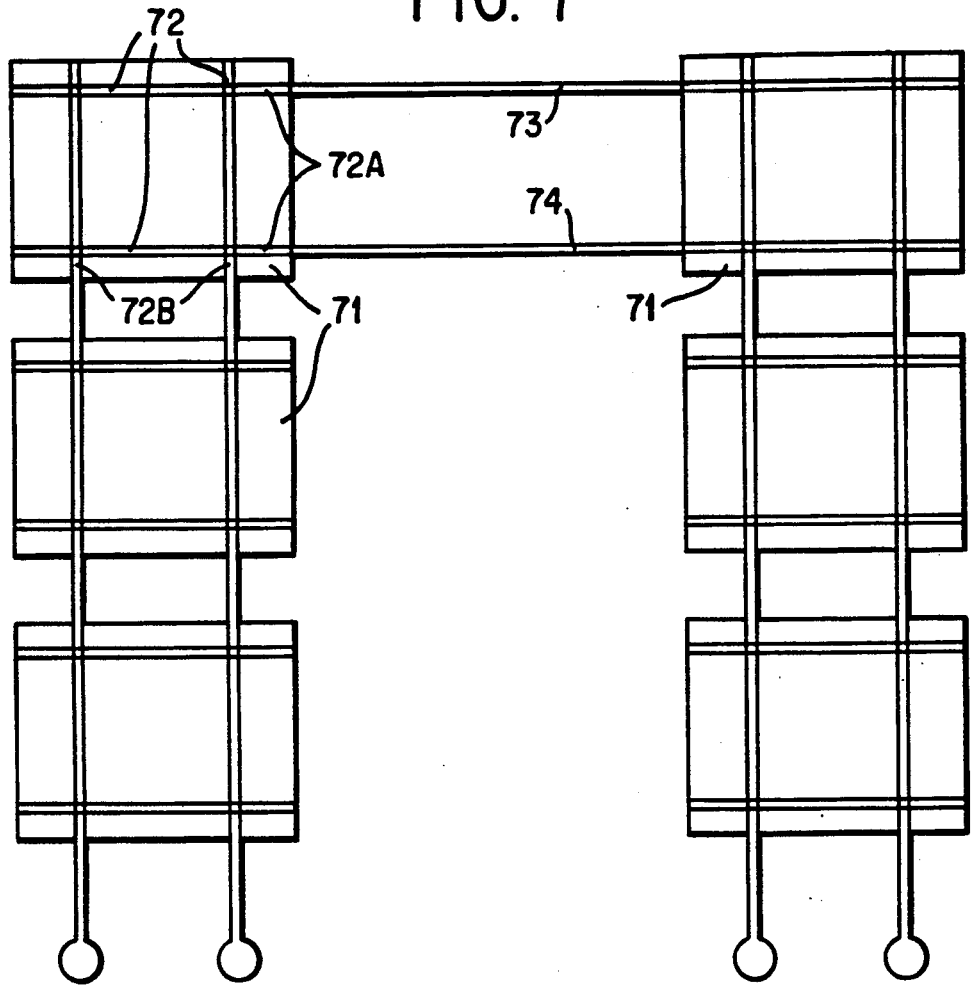
FIG. 7 is a plan view of a redundant bus and interconnection arrangement according to the invention.

In FIG. 7 is shown the feature of the invention employing redundant bus bars, to confine the interconnects within the bounds of the array of solar cells themselves and to reduce the amount of interconnecting material. It has been discovered that the loss of potentially productive solar cell area incurred thereby is not significantly greater than, and can be less than, that incurred by the conventional bus arrangements including busses that fall outside the bounds of the array of solar cells. And at least some of these arrangements are readily masked by the preceding techniques.

Further, FIG. 7 shows a general embodiment of this feature, wherein the busses are disposed inwardly from the edges of the cells.

The cells 71 are arranged in a multi-row array. While the cells 71 may in general be rectangular, the redundant busses 72 are disposed thereon in a square lattice arrangement, which is matched from cell to cell, so that any cell can be disposed in either of two orientations (e.g., grid along the row direction or grid orthogonal to the row direction, as shown). In either case, pairs of busses can be aligned with each other. Thus, interconnection between the rows is made between the top two cells in each row by interconnects 73 and 74, connecting to pairs of busses 72A that are otherwise redundant to the serial interconnection within each row. It is seen that the busses on the other cells which are parallel to busses 72A are truly redundant and unused; but the manufacturer is spared the expense of producing two types of cells and has greatly increased versatility in interconnection.

Figure 8:
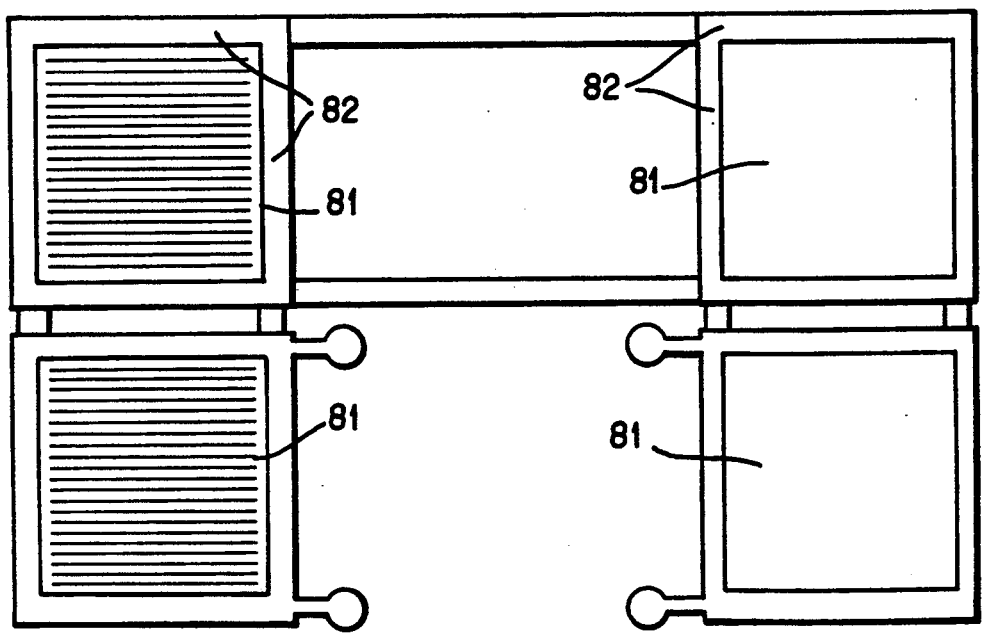
FIG. 8 is a plan view of another redundant bus and interconnection arrangement according to the invention.

In FIG. 8 is shown the preferred arrangement of redundant busses 82, which are moved to the edges of the cells to form conductive square frames. These cells 81 do not need to be square; but they preferably have their grids of collecting electrodes parallel throughout the array.

Figure 9:
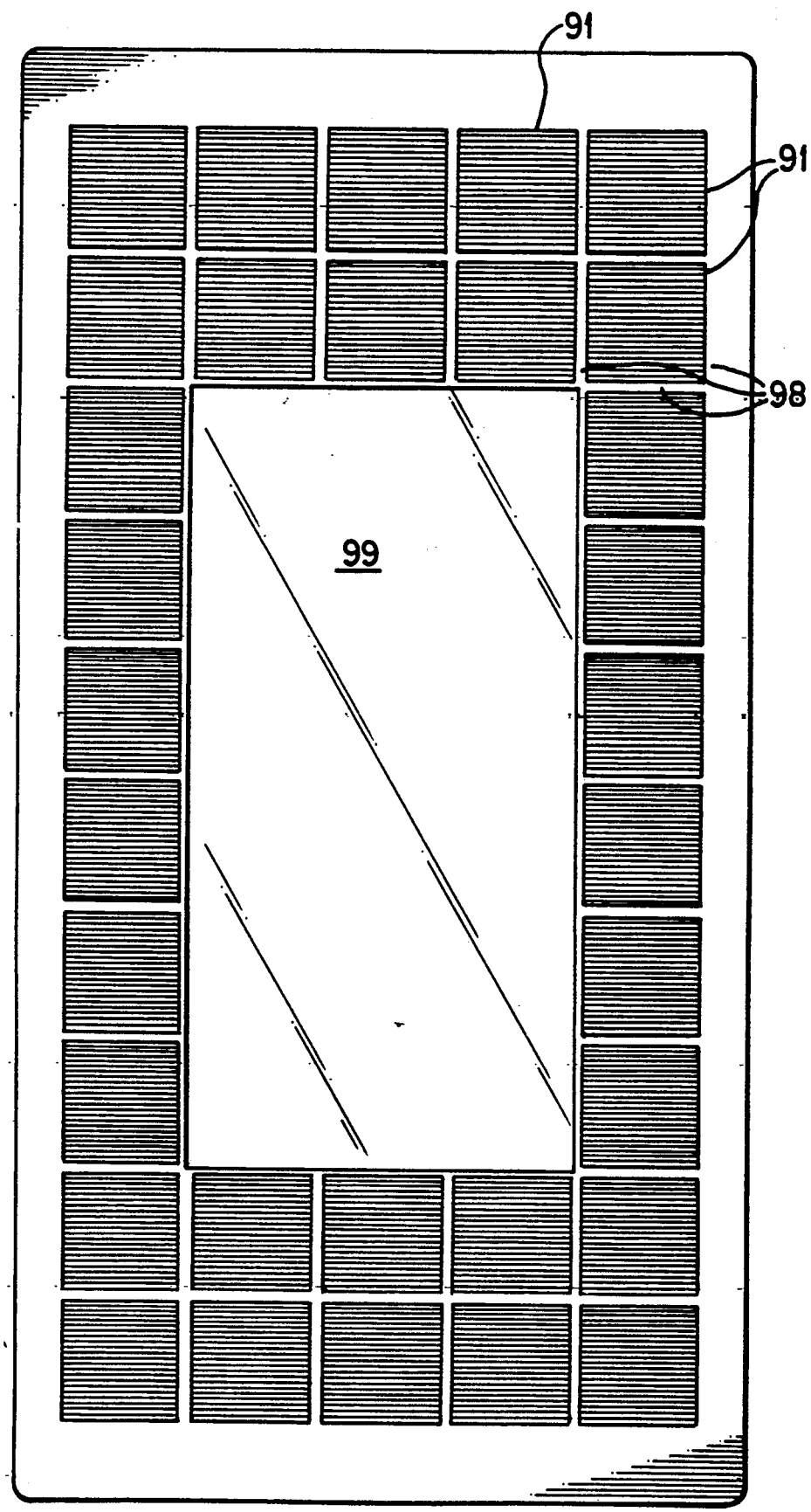
FIG. 9 is a plan view of another redundant bus and interconnection arrangement which is masked in accordance with a feature of the invention.

In FIG. 9, a modification of the arrangement of FIG. 8 for a vehicular sun roof is illustrated and, further, is shown with its busses and interconnects masked by the masking technique of FIG. 5. In FIG. 9, the solar cells are identified by reference numeral 91 and the masking structure by reference numeral 98. A clear window 99 is positioned in the center as is common on some vehicular sun roofs.

It will readily be appreciated that numerous other applications and modifications of the above-described structures and techniques can be made. In particular, its applicability to single-crystal, polycrystalline and amorphous solar panels, including transparent amorphous solar panels is indicated.

What is claimed is:

1. A solar panel comprising:
   a plurality of solar cells having radiation absorbing surfaces and opposed back surfaces;
   conducting means for interconnecting the solar cells;
   a transparent superstrate upon one surface of which the radiation absorbing surfaces are mounted; and
   means upon a surface of said transparent superstrate for masking said interconnecting means and for masking the peripheral edge portions of said radiation absorbing surfaces of said solar cells so as to present a uniform visual appearance to the panel.

2. The solar panel of claim 1 in which the plurality of solar cells are silicon solar cells.

3. The solar panel of claim 1 in which the plurality of solar cells include first and second pluralities of solar cells, the conductive interconnecting means including first means for interconnecting the first plurality of cells in series, second means for interconnecting the second plurality of cells in series, and third means for interconnecting the first plurality of solar cells with the second plurality of solar cells, said masking means being disposed to mask said first, second and third interconnecting means.

4. The solar panel of claim 3 in which the first, second and third interconnecting means are disposed toward the edges of said first and second pluralities of solar cells; and the masking means is disposed to mask the edges of said first and second plurality of solar cells at least to the innermost edges of all of said first, second and third interconnecting means.

5. The solar panel of claim 1 or of claim 4 in which the masking means comprises a deposited paint-like material adhered to a surface of the transparent superstrate.

6. The solar panel of claim 5 in which the deposited material is a matte-finish material.

7. The solar panel of claim 4 in which the masking means comprises a reflective material adhered to the surface of the transparent superstrate.

8. The solar panel of claim 7 in which the reflective material is a deposited metallic material.

9. The solar panel of claim 8 in which the reflective material is selected to reflect most of the solar radiation incident in alignment with the first, second and third interconnecting means.

10. A method of assembling a solar panel, comprising the steps of:
    depositing, upon a plurality of solar cells having radiation absorbing surfaces and opposed back surfaces, individual contacts upon said back surfaces, including forming interconnection leads extending from said contacts;
    interconnecting the plurality of solar cells in a substantially regular array with a selected pattern of conductors;
    uniformly masking the selected pattern of conductors and the peripheral edge portions of said radiation absorbing surfaces of said solar cells, including depositing a masking pattern of material upon a selected surface of a transparent superstrate; and
    mounting said plurality of said solar cells upon the transparent superstrate by joining said radiation receiving surfaces to a surface of said transparent superstrate in a substantially regular array with the leads and conductors substantially masked by the masking pattern.

11. The method of assembling a solar panel as in claim 10, in which the forming step comprises forming a plurality of the interconnection leads near the peripheral edges of each of said plurality of solar cells.

12. The method of assembling a solar panel as in claim 10 or claim 11, in which the interconnecting step includes interconnecting a first plurality of said solar cells in series, interconnecting a second plurality of solar cells in series, and interconnecting the first and second pluralities of solar cells; and the masking step comprising masking the results of the aforesaid interconnecting sub-steps.

13. The method of assembling a solar panel as in claim 10 or claim 11, in which the masking step comprises depositing a paint-like material as the masking pattern of material on the transparent superstrate.

14. The method of assembling a solar panel as in claim 13, in which the masking step comprises depositing a matte-finish material as the paint-like material on the transparent superstrate.

15. The method of assembling a solar panel as in claim 10 or claim 11, in which the masking step comprises depositing a reflective material as the masking pattern of material upon the transparent superstrate.

16. The method of assembling a solar panel as in claim 15 in which the reflective material depositing step comprises depositing a metallic material upon the transparent superstrate.

17. The method of assembling a solar panel as in claim 10 or 11 in which each of the plurality of solar cells include a grid of collecting electrodes on the radiation receiving surfaces thereof;
    the interconnecting step includes the step of orienting said plurality of solar cells in separate rows with the respective grids of collecting electrodes parallel;
    the interconnecting step further includes depositing patterns of separate proximate interconnects beyond ends of the separate rows to maintain serial connection of the solar cells from one row to the next row; and
    the masking step includes masking the separate proximate interconnects with a common strip of masking material.

18. The method of assembling a solar panel as in claim 10 or 11 in which the masking step comprises depositing the masking material on the transparent superstrate in a substantially symmetrical pattern.

19. A solar panel of the type comprising:
   a plurality of solar cells, each of said solar cells having a back contact;
   a grid of collecting electrodes on a radiation receiving surface of the cell;
   a plurality of busses superimposed on said grid to facilitate interconnection of the cells; and
   means for interconnecting said cells by interconnecting said busses,
   wherein the improvement comprises:
   said plurality of busses including a redundant plurality of busses, a first plurality of said busses being parallel to said grid and a second plurality of busses being orthogonal to said grid so as to form a square lattice arrangement;
   said interconnecting means comprising means for employing either said first plurality of busses or second plurality of busses.

20. The solar panel of claim 19 in which the plurality of solar cells are arranged in a plurality of rows requiring interconnection, the grids of collecting electrodes of said cells being maintained substantially parallel from row to row; and said interconnecting means being arranged within the bounds of said rows.

21. The solar panel of claim 19 or claim 20 further including a superstrate over said plurality of solar cells, and means on said superstrate for masking the busses and interconnecting means.

22. The solar panel of claim 21 in which the masking means is arranged in a symmetrical pattern.

23. The solar panel of claim 19 in which the plurality of solar cells are arranged in a plurality of rows in a bilaterally symmetrical pattern about a central open area, the grids of collecting electrodes being maintained substantially parallel from row to row, and the interconnecting means being arranged within the bounds of said rows.

24. The solar panel of claim 23 further including a superstrate over said plurality of solar cells, and means on said superstrate for masking the busses and interconnecting means.

25. The solar panel of claim 24 in which the masking means is arranged in a symmetrical pattern.

26. The solar panel of claim 24 or claim 25 in which the central open area is a portion of a substantially transparent or translucent medium of the type which can be installed in a vehicle.

* * * * *